(12) United States Patent
Kadoguchi et al.

(10) Patent No.: US 8,878,347 B2
(45) Date of Patent: Nov. 4, 2014

(54) POWER MODULE

(75) Inventors: Takuya Kadoguchi, Toyota (JP); Yoshikazu Suzuki, Toyota (JP); Masaya Kaji, Toyota (JP); Takanori Kawashima, Anjo (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 14/117,165

(22) PCT Filed: May 16, 2011

(86) PCT No.: PCT/JP2011/061239
§ 371 (c)(1),
(2), (4) Date: Nov. 12, 2013

(87) PCT Pub. No.: WO2012/157069
PCT Pub. Date: Nov. 22, 2012

(65) Prior Publication Data
US 2014/0197525 A1    Jul. 17, 2014

(51) Int. Cl.
*H01L 23/495* (2006.01)

(52) U.S. Cl.
USPC .................................................... 257/666

(58) Field of Classification Search
CPC ........... H01L 2924/01078; H01L 2924/01079; H01L 2924/01013; H01L 2924/01029; H01L 2924/14
USPC ......... 257/666, 672, 676, 685, 686, 784, 777; 438/106–110, 112, 127
See application file for complete search history.

(56) References Cited

U.S. PATENT DOCUMENTS

2014/0035112 A1*  2/2014  Kadoguchi et al. ........... 257/666

FOREIGN PATENT DOCUMENTS

| JP | 2001-308263 A | 11/2001 |
| JP | 2005-303018 A | 10/2005 |
| JP | 2006-049542 A | 2/2006 |
| JP | 2006-134990 A | 5/2006 |
| JP | 2009-071064 A | 4/2009 |

* cited by examiner

*Primary Examiner* — Hoa B Trinh
(74) *Attorney, Agent, or Firm* — Kenyon & Kenyon LLP

(57) ABSTRACT

A power module configured to arrange a first electrode on a surface of which a first switching device is bonded, a second electrode on a surface of which a second switching device is bonded, and a third electrode by stacking the first electrode, the first switching device, the second electrode, the second switching device, and the third electrode in this order from the bottom in a stacking direction, characterized by first through third electrode pieces each connected to the first through third electrodes, first and second signal lines each connected to the first and second switching devices, wherein the first through third electrode pieces and the first and second signal lines are provided extending outward in the same plane as the second electrode.

10 Claims, 17 Drawing Sheets

POWER MODULE

CROSS REFERENCE TO RELATED APPLICATION

This is a national phase application based on the PCT International Patent Application No. PCT/JP2011/061239 filed on May 16, 2011, the entire contents of which are incorporated herein by reference.

TECHNICAL FIELD

The present invention relates to a power module, and more specifically, to a power module configured to stack a first electrode on which a first switching device is attached, a second electrode on which a second switching device is attached and a third electrode.

BACKGROUND ART

Conventionally, a power module to perform voltage conversion or power conversion of direct voltage is known. In the power module, a power module is proposed that includes a high side electrode and a low side electrode that respectively receive a high potential side and a low potential side of the direct voltage, first and second switching devices that are connected between the high side electrode and the low side electrode in series, and a middle side electrode (output electrode plate) connected to an intermediate point of the first switching device and the second switching device, wherein the first switching device and the second switching device are stacked and installed through the middle side electrode (for example, see Patent Document 1).

In the power module, a mounting area can be smaller than that of a power module configured to arrange switching devices on a plane surface because the switching devices are arranged in series in the stack direction. In particular, when the number of mounted semiconductor switching devices is desired to be increased for high output, a plurality of switching devices can be mounted without increasing the mounting area, which can be downsized and attain high output.

[Patent Document 1] Japanese Laid-Open Patent Application Publication No. 2006-49542

DISCLOSURE OF THE INVENTION

Problems to be Solved by the Invention

In the meanwhile, in a configuration described in the above-mentioned Patent Document 1, the power module is configured to provide a signal line outside each of the middle side electrode and the low side electrode arranged at different heights, to solder the first switching electrode and the second switching electrode to the middle side electrode and the low side electrode, to bond the first switching device and the second device to each signal line by wire, and then to stack the middle side electrode and the low side electrode. Here, because the signal lines and the electrodes are required to be insulated and to be held by a lead frame outside a mold resin, a holding frame is provided for each of the middle side electrode and the low side electrode. The holding frame must be formed as a shape that has an overlapping part in a same area when seen from a planar perspective from a relationship with a space.

However, although in performing a mold sealing with mold resin, the signal lines and the holding frame are required to be clamped by dies from top and bottom, if the overlapping part exists between the upper holding frame and the lower holding frame, molding cannot be performed by simply sandwiching the dies from the top and the bottom, and forming the dies becomes extremely difficult.

Therefore, the present invention is intended to provide a power module that can readily perform molding and can attain compact high power while simplifying an electrode shape.

Means for Solving Problems

In order to achieve the object described above, an embodiment of the present invention may provide a power module that is configured to arrange a first electrode on a surface of which a first switching device is bonded, a second electrode on a surface of which a second switching device is bonded, and a third electrode by stacking the first electrode, the first switching device, the second electrode, the second switching device, and the third electrode in this order from a bottom in a stacking direction, characterized by first through third electrode pieces each connected to the first through third electrodes, first and second signal lines each connected to the first and second switching devices, wherein the first through third electrode pieces and the first and second signal lines are provided extending outward in the same plane as the second electrode.

Effect of the Invention

According to embodiments of the present invention, in a stacking-type power module capable of compact high output, molding can be readily performed and an electrode structure can be simplified.

Figure 1:
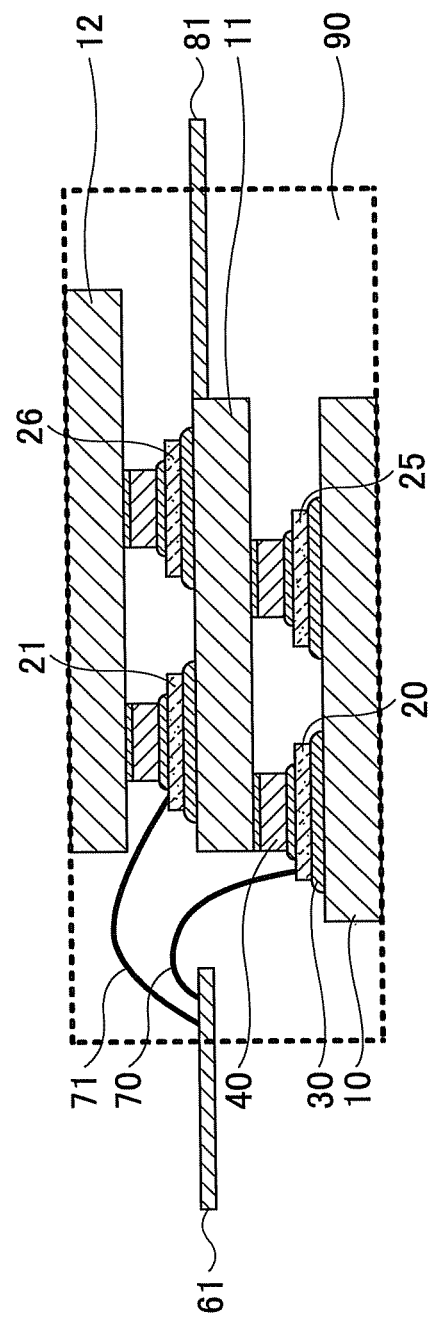
FIG. 1 is a cross-sectional configuration view showing an example of a power module of a first embodiment of the present invention.

EXPLANATION OF REFERENCE SIGNS 10, 15 Lower electrode
11, 13, 16 Middle electrode
12, 14, 17 Upper electrode
20, 21, 22, 23 Semiconductor switching device
25, 26, 27, 28 Diode
30, 31 Solder
40, 41, 42 Spacer
50, 51 Lead frame
60, 61, 62, 63 Signal line
80, 81, 82, 83, 84, 85 Electrode piece
90, 91 Mold resin
100, 101, 102 Die

BEST MODE FOR CARRYING OUT THE INVENTION

A description is given below, with reference to drawings of embodiments of the present invention.

First Embodiment

FIG. 1 is a cross-sectional configuration view showing an example of a power module of a first embodiment of the present invention. In FIG. 1, the power module of the first embodiment includes a lower electrode 10, a middle electrode 11, an upper electrode 12, semiconductor switching devices 20, 21, diodes 25, 26, solder 30, spacers 40, a signal line 61, bonding wires 70, 71, and an electrode piece 81. Moreover, in FIG. 1, mold resin 90 is shown by a broken line.

In FIG. 1, the semiconductor switching device 20 and the diode 25 are bonded on a surface of the lower electrode 10 by the solder 30, and the spacers 40 are each bonded on the semiconductor switching device 20 and the diode 25 by the solder 30. The middle electrode 11 is bonded on the spacers 40 by the solder 30 similarly, and the semiconductor switching device 21 and the diode 26 is bonded on a surface of the middle electrode 11 by the solder 30. In this manner, the power module of the first embodiment has a structure stacking the lower electrode 10, the semiconductor switching device 20 and the diode 25, the middle electrode 11, the semiconductor switching device 21 and the diode 26, and the upper electrode 12 in this order through the spacers 40 in the middle of therebetween. Here, because the solder 30 between the spacers 40 and the middle electrode 11, and the solder 30 between the spacers 40 and the upper electrode 12 are very thin, the solder between the spacers and the electrodes are omitted in the drawings after FIG. 1.

The signal line and the electrode piece 81 are arranged on a same place as the middle electrode 11. The semiconductor switching device 21 on the middle electrode 11 is connected to the signal line 61 by a bonding wire 71. Furthermore, the electrode piece 81 is provided so as to extend outward from the middle electrode 11.

Figure 2:
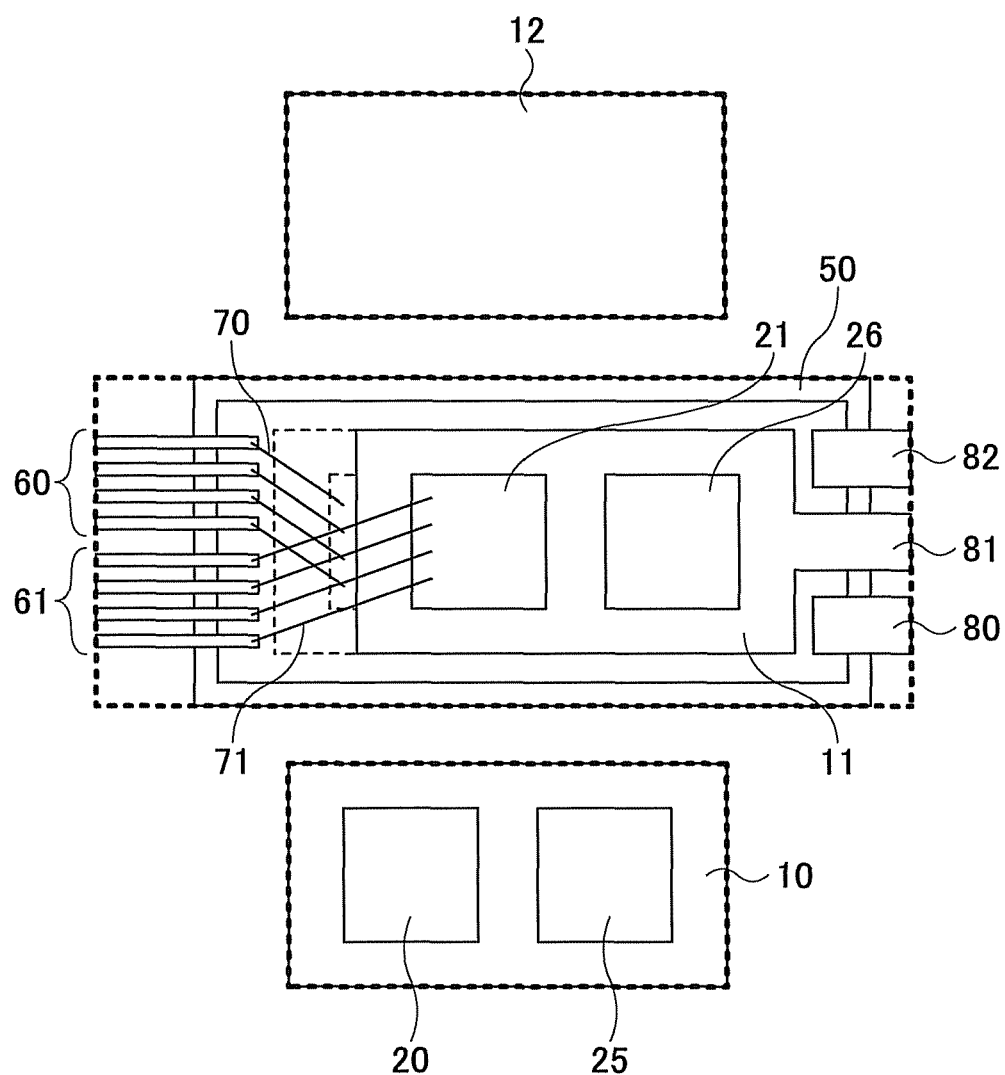
FIG. 2 is an exploded plan view showing an example of the power module of the first embodiment.

FIG. 2 is a plane exploded view of an example of a power module of the first embodiment of the present invention, and corresponds to FIG. 1. Accordingly, the same numerals are attached to the same components as those of FIG. 1.

In FIG. 2, providing the semiconductor switching device 20 and the diode 25 on the surface of the lower electrode 10 and providing the semiconductor switching device 21 and the diode 26 on the surface of the middle electrode 11, are similar to FIG. 1.

On the other hand, FIG. 2 newly shows a configuration including a lead frame 50 provided so as to surround the middle electrode 11, a signal line 60 in addition to a signal line 61 provided on the left side of the lead frame 50, and electrode pieces 80, 82 in addition to the electrode piece 81 provided on the right side.

Moreover, the upper surface of the upper electrode 12 is similar to the configuration shown in FIG. 1.

The signal line 60 is a signal line behind the signal line 61 in FIG. 1, and the semiconductor switching device 20 on the surface of the lower electrode 10 is connected to the signal line 60. Furthermore, the semiconductor switching device 21 on the surface of the middle electrode 11 is connected to the signal line 61, as shown in FIG. 1.

As shown in FIGS. 1 and 2, the signal lines 60 and the signal line 61 are both arranged to extend outward in the same plane as the middle electrode 11. Here, as noted from FIGS. 1 and 2, the semiconductor switching device 20 on the lower electrode 10 has an area that is not covered with the middle electrode 11 in a stacking direction. In other words, the left end of the semiconductor switching device 20 sticks out of the middle electrode 11 when the top view of the semiconductor switching device 20 is seen from the middle electrode 11. This enables the semiconductor switching device 20 on the lower electrode 10 to be readily connected to the signal line 60 by the bonding wires 70 without allowing the middle electrode to interrupt connection paths.

In addition, the electrode piece 80 to be connected to the lower electrode 10 and the electrode piece 82 to be connected to the upper electrode 12 are arranged on both sides of the electrode piece 81. As shown in FIGS. 1 and 2, the electrode piece 81 is provided so as to extend rightward from the middle electrode 11. In contrast, the electrode piece 80 extends downward and obliquely inward (toward the center), and the electrode piece 82 extends upward and obliquely outward (toward the center). When the lower electrode 10 and the upper electrode 12 are respectively arranged below and above the middle electrode 11, the electrode piece 80 and the electrode piece 82 are configured to respectively contact the lower electrode 10 and the upper electrode 12. Detailed description in this regard is given below.

Moreover, as shown in FIG. 2, the middle electrode 11, the signal lines 60, 61 and the electrode pieces 80, 81, 82 are all made of a single piece of the lead frame 50. This allows the middle electrode 11, the signal lines 60, 61, the electrode pieces 80, 81, 82 and the lead frame 50 to all be formed by processing a single metal plate, which can make the process of the power module of the first embodiment extremely easy.

Furthermore, in FIGS. 1 and 2, the middle electrode 11 is constituted of different shaped materials with different thicknesses, but the lower electrode 10 and the upper electrode 12 are each constituted of a plate material having a plate-like shape. This causes a processing cost of the lower electrode 10 and the upper electrode 12 to be reduced, and can improve the yield rate. In addition, the lower electrode 10 and the upper electrode 12 may be formed as the same electrode member that has the same shape as each other. This makes it possible to form the lower electrode 10 and the upper electrode 12 by using a same die, and to reduce the processing cost. The lower electrode 10 and the upper electrode 12 may be formed into a simple shape, and for example, may be formed as a rectangular shape. Because a plate-like member having a rectangular shape can be produced at a low cost, the yield rate can be further improved.

Next, with reference to FIGS. 1 and 2, a description is given below of respective components.

The lower electrode 10 is an electrode arranged on the lower side, and is provided including the semiconductor switching device 20 and the diode 25 bonded on the surface thereof. Here, bonding the semiconductor switching device 20 and the diode 25 on the surface of the lower electrode 10 is performed by using the solder 30. The semiconductor switching device 20 and the diode 25 are bonded to the lower electrode 10 by the solder 30 not only physically but also electrically.

The semiconductor switching device 20 is a device to switch on/off by allowing a voltage to be applied, and for example, an IGBT (Insulated Gate Bipolar Transistor), a MOS (Metal Oxide Semiconductor) transistor and the like are available. The diode 25 is a rectifying device provided by being connected in parallel to the semiconductor switching device 20.

The signal line 60 is connected to a control terminal such as a gate of the semiconductor switching device 20, and on/off of the semiconductor switching device 20 is controlled by input from the signal line 60. Conventionally, in the semiconductor switching device 20 provided on the surface of the lower electrode 10, the signal line 60 is provided in the same horizontal plane as the lower electrode 10, but in the power module of the present embodiment, the signal line 60 is arranged in the same horizontal plane as the middle electrode 11, and the semiconductor switching device 20 is connected to the signal line 60 located on the upper side by the bonding wire 70.

The spacer 40 plays a role in electrically connecting the middle electrode 11 to the semiconductor switching device 20 as well as in forming a space between the middle electrode 11 and the semiconductor switching device 20. By forming the space between the semiconductor switching device 20 and the middle electrode 11, heat generated in the semiconductor switching device 20 can be efficiently released. The spacer 40 may be, for example, made of a metal block formed into a column shape, and for example, may be made of a copper block. The spacer 40 on the diode 25 forms a space between the diode 25 and the middle electrode 11, and also electrically connects the diode 25 to the middle electrode 11.

Here, the lower electrode 10 is connected to the electrode piece 80 provided in the same plane as the electrode piece 81, and the electrode piece 80 supplies electricity to the lower electrode 10.

The middle electrode 11 is an electrode that becomes an output electrode of the semiconductor switching device 20, 21. The semiconductor switching device 21 on the surface of the middle electrode 11 is also electrically connected to the middle electrode 11 by solder bond. The semiconductor switching device 21 is a switching device on/off of which is controlled by application of a voltage, the IGBT and the MOS transistor may be used similarly to the semiconductor switching device 20. Moreover, the diode 26 is a rectifying device connected in parallel to the semiconductor switching device 21. A control terminal such as a gate of the semiconductor switching device 21 is connected to the signal line 61 lying in the same plane as the middle electrode 11 by the bonding wire 71. Furthermore, the electrode piece 81 horizontally extends from the middle electrode 11, and supplies electricity to the semiconductor switching device 21 and the diode 26 on the middle electrode 11 by being connected to outside.

The upper electrode 12 is an electrode that is stacked on the semiconductor switching device 21 and the diode 26 through the spacer 40 and covers the semiconductor switching device 21 and the diode 26 through the spacer 40. Because the spacer 40 is a metal block as stated above, and serves as an interconnection, the spacer 40 electrically connects the semiconductor switching device 21 and the diode 26 to the upper electrode 12. In addition, the spacer 40 forms a space between the semiconductor switching device 21 and the diode 26, and the upper electrode 12, and plays a role in promoting heat release.

In addition, the upper electrode 12 is connected to the electrode piece 82, and electricity is supplied to the upper electrode 12 from the electrode piece 82. For example, when the electricity supplied to the upper electrode 12 is assumed to be a high potential side, and the electricity supplied to the lower electrode 10 is assumed to be a low potential side, the middle electrode 11, the semiconductor switching device 21 and the diode 26 constitute an upper arm, and the lower electrode 10, the semiconductor switching device 22 and the diode 25 constitute a lower arm.

Moreover, the power module of the first embodiment has a structure of connecting the semiconductor switching devices 20, 21 in series and a structure of compact high output of a device stacking type.

Here, as shown in FIG. 2, at a first stage, the signal lines 60, 61 and the electrode pieces 80 through 82 are all connected to the lead frame 50, and the lead frame 50 is molded so as to protrude to the outside of the mold resin 90. Then, after the molding, the lead frame 50 that protrudes to the outside from the mold resin 90 is cut, and the lower electrode 10, the middle electrode 11 and the upper electrode 12 become insulated from each other. In FIG. 1, the power module in a state in which the lead frame 50 has already been cut is shown.

Figure 3:
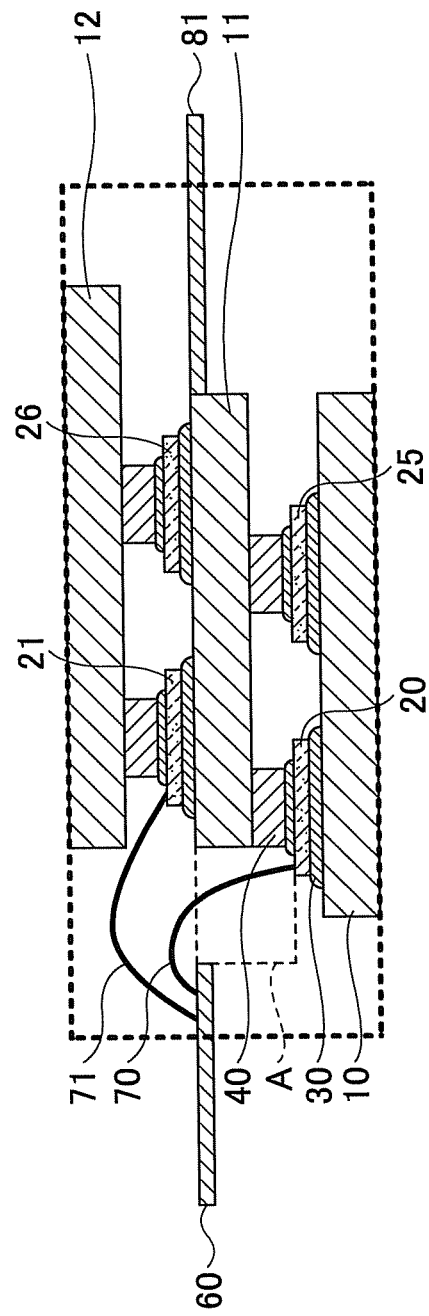
FIG. 3 is an explanatory drawing of an arrangement location of a middle electrode of the power module of the first embodiment.

FIG. 3 is a diagram to illustrate an arrangement position of the middle electrode 11 of the power module of the first embodiment of the present invention. Here, because a whole structure and individual components are almost the same as those of FIG. 1, the same numerals are used and the description is omitted.

In FIG. 3, a part of the surface of the semiconductor switching device 20 has an area A that does not overlap with the middle electrode 11. In other words, the middle electrode 11 is arranged to keep away from the upper surface of a signal pad provided on the switching device 20. Such a configuration makes it possible to ensure the free area A above the semiconductor switching device 20, and makes it easy to connect the semiconductor switching device 20 on the lower side to the signal line 60 by a bonding connection. Moreover, the upper electrode 12 is arranged at a position that overlaps with the middle electrode 11, and ensures a space for wire bonding of the semiconductor switching device 20.

Thus, by ensuring a connecting space above the semiconductor switching device 20 installed on the lower electrode 10, the power module is formed to be able to readily perform the wire bonding.

Figure 4:
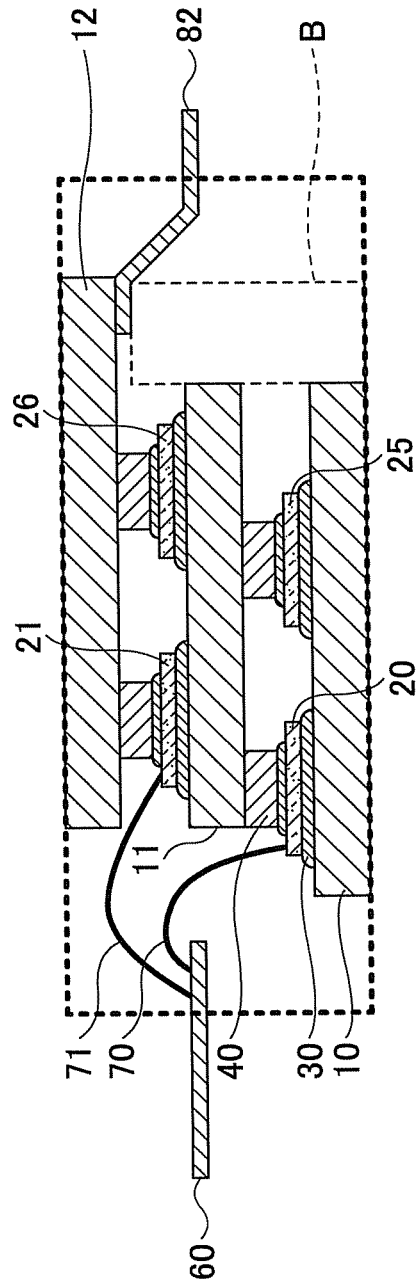
FIG. 4 is a configuration view showing an example of an electrode piece connected to an upper electrode of the power module of the first embodiment.

FIG. 4 is a configuration view showing an example of an electrode piece 82 connected to the upper electrode 12 of the power module of the first embodiment of the present invention. FIG. 4 shows a cross-sectional configuration including the electrode piece 82 connected to the upper electrode 12 of the power module of the present embodiment. In FIG. 4, the electrode piece 82 has a shape that spreads from the center towards the edges so as to connect parallel lines to each other, and an upper surface of one end is connected to a lower surface of the right side end of the upper electrode 12. Furthermore, the electrode piece 82 is shaped to extend obliquely downward from the right side end of the lower surface of the upper electrode 12 so as to spread outward to the same plane as the middle electrode 11, and to horizontally extend outward therefrom. In addition, a space B that does not include the middle electrode 11 and the lower electrode 10 is ensured under the connecting point of the electrode piece 82 with the lower surface of the upper electrode 12. The connection of the electrode piece 82 to the upper electrode 12 is performed by flipping the upper electrode 12 and the lower electrode 10 upside down so as to put the upper electrode 12 on the lower side, and so as to put the lower electrode 10 on the upper side, and then by dropping the solder 30 to the connection part of the electrode piece 82 from above. In such a case, because a space for processing to connect the electrode piece 82 to the upper electrode 82 is required to be ensured, as shown in FIG. 4, the middle electrode 11 and the lower electrode 10 that prevent the solder 30 dropping are not provided in the area B under the connection part of the electrode piece 82 with the upper electrode 12, and the space for connecting work is ensured.

In this manner, as necessary, by providing the area B without the middle electrode 11 and the lower electrode 10 under the connecting point between the upper electrode 12 and the electrode piece 82, the connecting space for connecting the electrode piece 82 to the upper electrode 12 can be ensured. Here, the area B is not required, and may be provided if desired.

Here, because the electrode piece 80 extending from the lead frame 50 lying in the same plane as the middle electrode 11 is connected to the lower electrode 10 at the same time when the lower electrode 10 is connected to the middle electrode, a space like the area B is not needed to be provided for the piece electrode 80.

Figure 5:
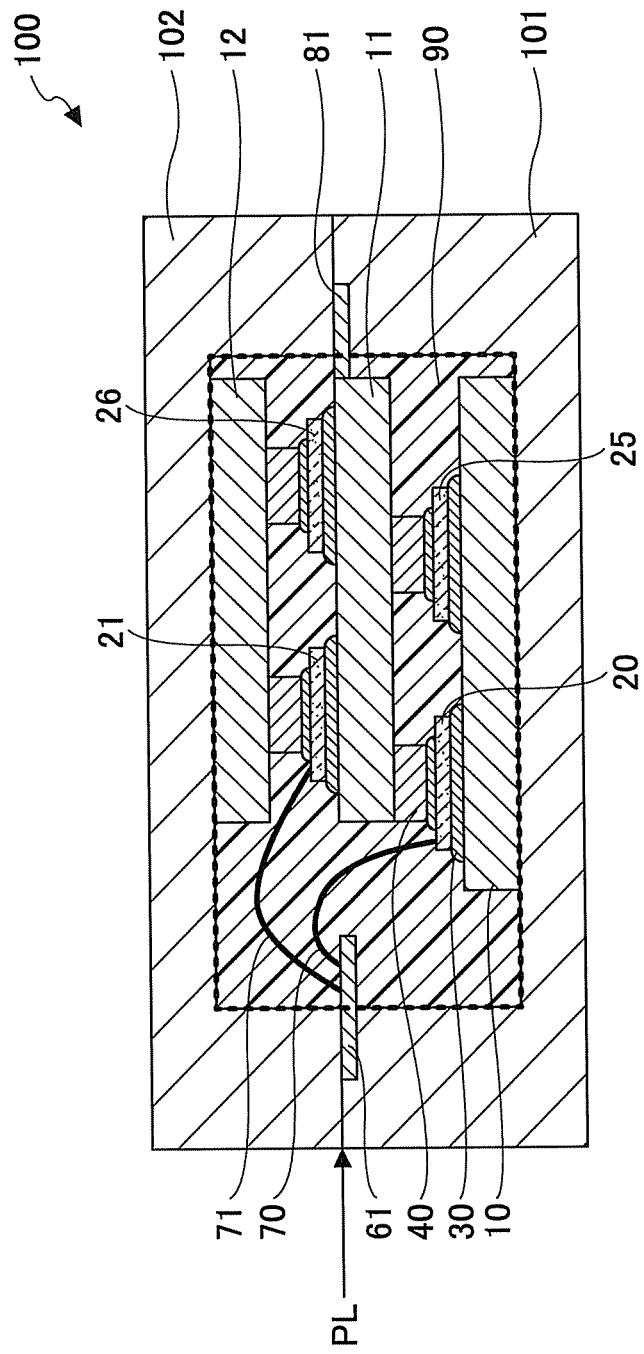
FIG. 5 is a view showing an example of a molding process of the power module of the first embodiment.

FIG. 5 is a view showing an example of a molding process of the power module of the first embodiment of the present invention. FIG. 5 shows a state of a power module of the first embodiment that is clamped by a die 100 to perform molding. The die 100 includes a upper die 102 and a lower die 101, and the molding is performed by clamping both the upper die 102 and the lower die 101, by filling the space with the mold resin 90 and by molding the mold resin 90.

Here, in the power module of the first embodiment, because the signal lines 60, 61 and the electrode pieces 80 through 82 coincide with a parting line PL that is a border of the upper die 102 and the lower die 101, mold clamping can be performed by aligning the signal lines 60, 61 and the electrode pieces 80 through 82 with the parting line PL. More specifically, for example, by forming a mold that can accommodate the signal lines 60, 61 on the left side of the lower die 101, and by forming a mold that can accommodate the electrode pieces 80 through 82 on the right side of the lower die 101, a mold for molding by clamping the upper die 102 and the lower die 101 is formed, and the molding can be performed readily. This makes it easy and simple to form the die 100, and makes it possible to perform the molding itself by using a general process.

Thus, according to the power module of the present embodiment, by making all of the heights of the signal lines 60, 61 and the electrode pieces 80 through 82 the same as the height of the middle electrode 11 that accords with the parting line PL of the die 100, the shape of the die 100 can be simplified, and the molding can be performed readily.

Furthermore, because the upper electrode 12 and the lower electrode 10 can be made of a plate-like member, the yield rate can be greatly improved. In addition, in connecting the semiconductor switching device 20, 21 to the signal lines 60, 61 by performing the wire bonding, because the connecting space is ensured, the connection can be readily carried out.

Figure 6A:
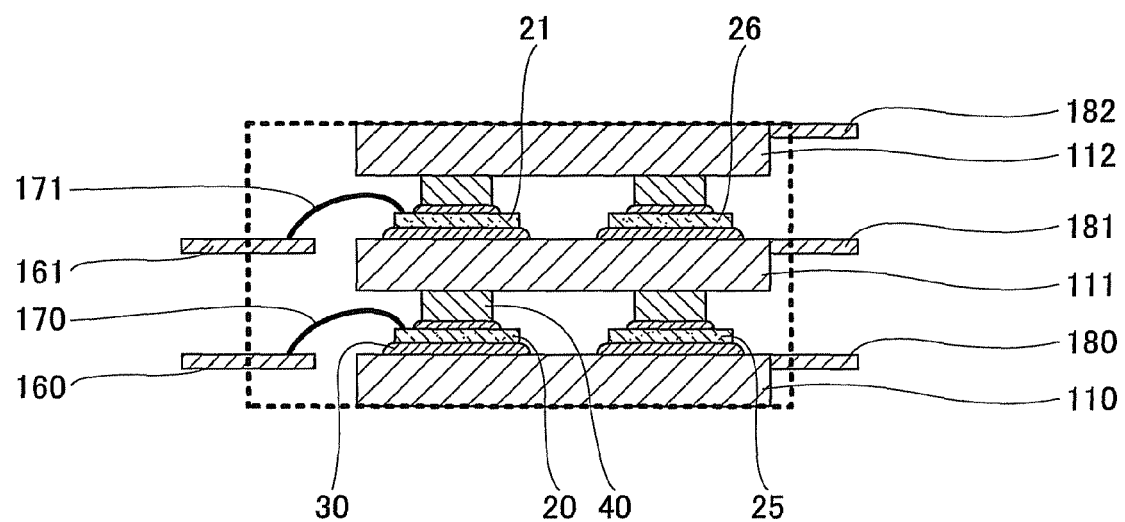
FIG. 6A is a view showing a configuration of a conventional power module as a comparative example.

FIG. 6A is a view showing a configuration of a conventional power module as a comparative example. In FIG. 6A, the conventional power module is similar to the power module of the present embodiment in terms of having a stacking structure configured to stack a lower electrode 110, a semiconductor device 20 and diode 26, spacers 40, and an upper electrode 112 in this order, but different from the power module of the present embodiment in terms of providing a signal line 160 and the lower electrode 110 in the same plane, a signal line 161 and a middle electrode in the same plane, an electrode piece 180 and the lower electrode in the same plane, an electrode piece 181 and the middle electrode 111 in the same plane, and an electrode piece 182 and the upper electrode 112 in the same plane. Along with such an arrangement, connecting the signal line 160 with the semiconductor switching device 20 on the lower electrode 110 is performed by a bonding wire 170 in the same plane, and connecting the signal line 161 with the semiconductor switching device 21 on the middle electrode 111 is performed by a bonding wire 171 in the same plane.

In such a configuration, both the lower electrode 110 and the middle electrode 111 differ in thickness from the signal lines 160, 161 and the electrode pieces 180, 181, and a combination of different shaped members constitute the whole structure. Moreover, the upper electrode 112 and the electrode piece 182 differ in thickness, and the power module is constituted of a combination of different shaped members having different thicknesses. Hence, because the middle electrode 111 and the lower electrode 110 are formed to have different parts in thickness as a whole including the signal lines 160, 161 and the electrode pieces 180, 181, there was a concern of decreasing the yield rate of processing due to the complicated structure and increasing the cost of manufacturing the electrode member.

Figure 6B:
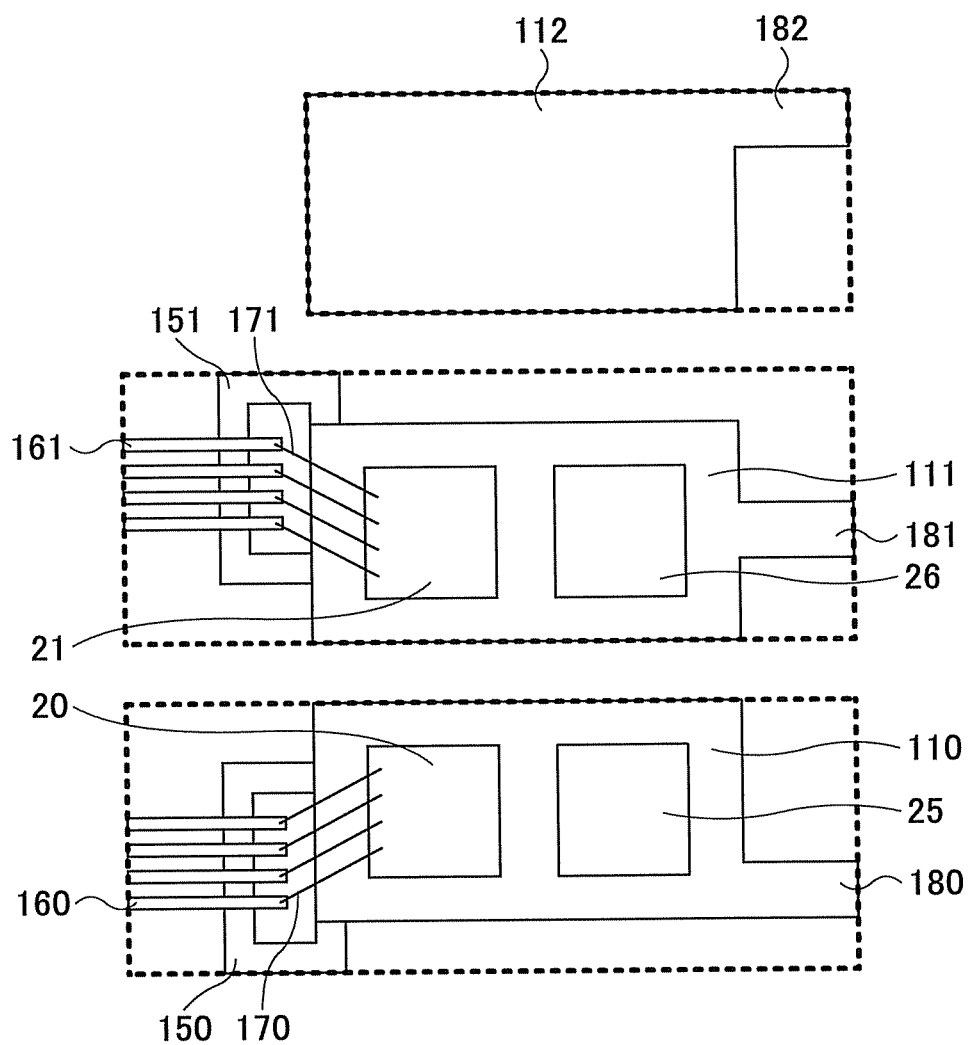
FIG. 6B is a exploded plan view showing a configuration of the conventional power module as the comparative example.

FIG. 6B is an exploded plan view showing a configuration of a conventional power module as a comparative example, which corresponds to FIG. 6A. As shown in FIG. 6B, all of the lower electrode 110, the middle electrode 111 and the upper electrode 112 have different shapes from each other when including the electrode pieces 180, 181, 182, and an electrode made of a simple plate member is not included, unlike the power module of the present embodiment. Accordingly, the yield rate when manufacturing the electrodes is decreased. In addition, noting lead frames 150, 151 provided at the lower electrode 110 and the middle electrode 111, when the middle electrode 111 is stacked on the lower electrode 110 and seen from the top, the lower electrode 110 and the middle electrode 111 have an overlapping part with each other. Such a part is difficult to be molded when molding, which is described below.

Figure 6C:
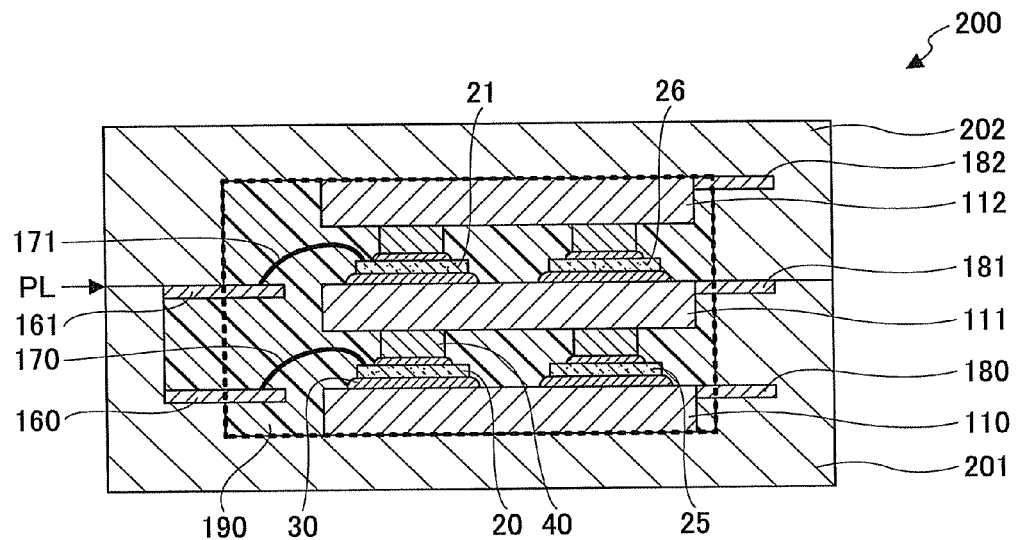
FIG. 6C is a view showing a molding process of the conventional power module as the comparative example.

FIG. 6C is a view showing a molding process of the conventional power module as a comparative example. In FIG. 6C, the conventional power module is clamped by a die 200 composed of an upper die 202 and a lower die 201. In FIG. 6C, with respect to the right-side electrode pieces 180 through 182, by displacing projecting locations of the electrode pieces 180 through 182 when seen from the top, the molding is possible.

However, with respect to parts of the signal lines 160, 161, because the lead frames 150, 151 overlap with each other, the signal lines 160, 161 cannot be clamped by the upper die 202 and the lower die 201 from top and bottom.

In this manner, in the conventional power module, because the signal lines 160, 161 do not lie in the same plane, and because the signal lines 160, 161 cannot be arranged to be sandwiched from the top and the bottom at the parting line PL, processing the conventional power module by a simple molding is impossible, which increases the processing cost.

On the other hand, according to the power module of the present embodiment, as shown in FIG. 5, the signal lines 60, 61 and the electrode pieces 80 through 82 are all arranged on the same parting line PL, and clamping can be performed by only sandwiching thereof from top and bottom, by which the molding can be readily performed. Moreover, because the upper electrode 12 and the lower electrode 10 can be made of the plate-like member, the yield rate can be substantially improved.

In this way, according to the power module of the present embodiment, by simplifying the die 100 used in molding and the electrodes 10, 12 of the power module itself, the yielding rate in manufacturing can be substantially enhanced while maintaining compact high output.

Second Embodiment

Figure 7:
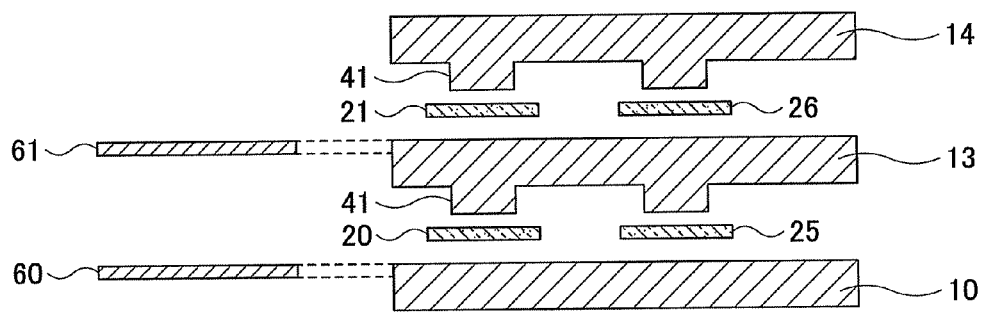
FIG. 7 is a view showing an example of a power module of a second embodiment.

FIG. 7 is a view showing an example of a power module of a second embodiment of the present invention. In FIG. 7, the power module of the second embodiment includes a lower electrode 10, a middle electrode 13, an upper electrode 14, semiconductor switching devices 20, 21, and signal lines 60, 61. In FIG. 7, only a part changed from the first embodiment is shown, but the other components may be included similarly to the first embodiment. Furthermore, with respect to the components similar to the power module of the first embodiment, the same numerals as the first embodiment are used, and the description is omitted.

In FIG. 7, the power module of the second embodiment differs from the power module of the first embodiment in terms of the lack of the spacers 40 existing in the first embodiment and of including convex parts 41 provided on lower surfaces of the middle electrode 13 and the upper electrode 14 instead of the spacers 40. Thus, as long as spaces between the semiconductor switching device 20 and the middle electrode 13, and between the semiconductor switching device 21 and the upper electrode 14, can be maintained properly, and the semiconductor switching devices 20, 21 can be connected with each other, the electrode-integrated convex parts 41 may be provided.

Figure 8:
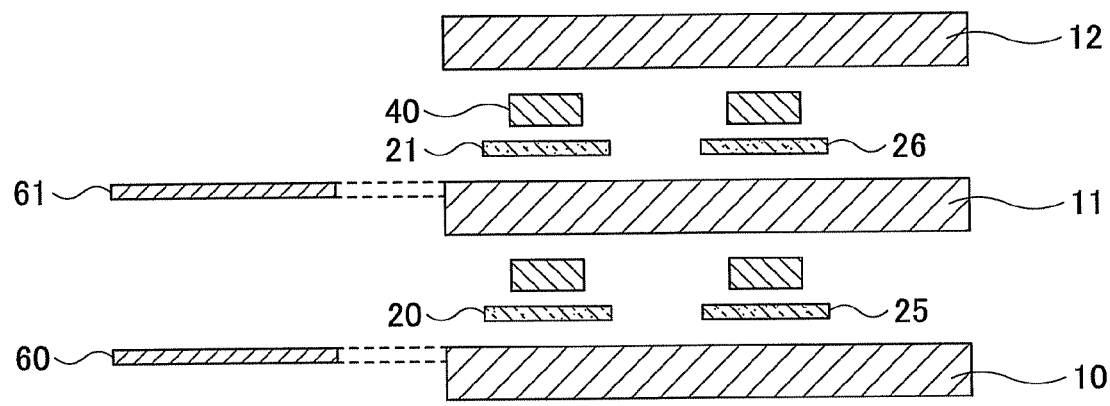
FIG. 8 is a view showing an example of a power module of a third embodiment.

FIG. 8 is a view showing the power module of the first embodiment in a form similar to FIG. 7. As shown in FIG. 8, when the spacers 40 are individually provided, the number of the parts is increased.

In contrast, in FIG. 7, even though shapes of the middle electrode 13 and the upper electrode 14 are slightly difficult, and the cost of processing the electrodes is increased, by removing the spacers 40, the number of the parts can be reduced, and the assembling and processing cost can be also reduced. Hence, whether to form the power module of the second embodiment as shown in FIG. 7 or whether to form the power nodule of the first embodiment as shown in FIG. 8, can be properly selected according to the intended use and the total cost.

Here, the convex parts 41 may be provided on the upper side of the semiconductor switching devices 20, 21 and the diodes 25, 26, for example, as convex parts of 1 mm or more.

In this manner, according to the power module of the second embodiment, the number of the parts and the processing cost in assembling can be reduced, and the cost reduction can be achieved.

Third Embodiment

Figure 9:
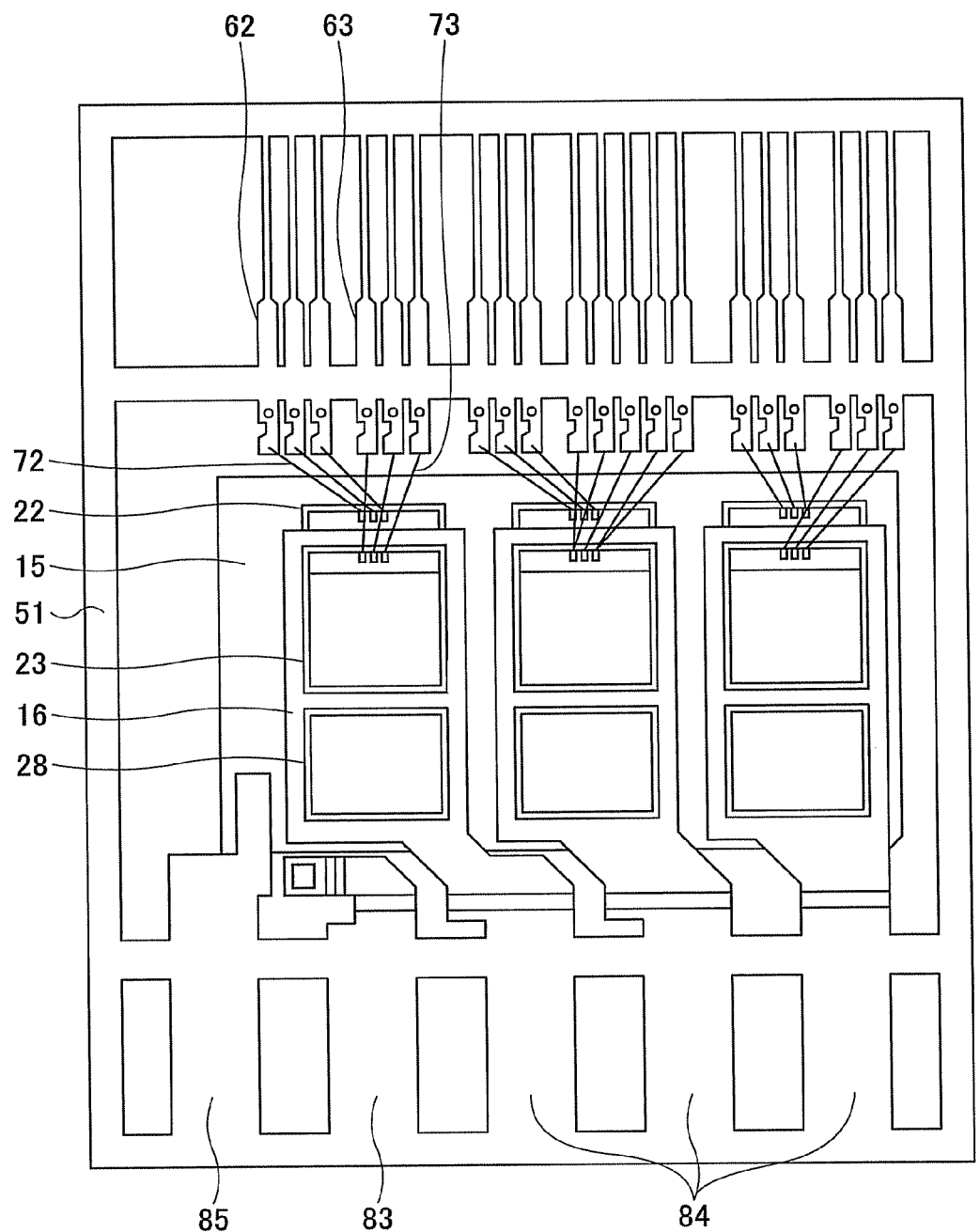
FIG. 9 is a view showing plan composition of a middle electrode of an example of the power module of the third embodiment of the present invention.

FIG. 9 is a view showing a plane configuration of a middle electrode of an example of a power module of a third embodiment. In FIG. 9, the power module of the third embodiment includes a lower electrode 15, middle electrodes 16, semiconductor switching devices 22, 23, a diode 28, a lead frame 51, signal lines 62, 63, bonding wires 72, 73, and electrode pieces 83, 84, 85. The middle electrodes 16, the signal lines 62, 63 and the electrode pieces 83 through 84 are formed on the single lead frame 51, in the same plane.

In the power module of the third embodiment, three of the semiconductor switching devices 22, 23 and the diode 28 are respectively provided on the lower electrode 15 and the middle electrodes 16, and the power module of the third embodiment differs from the power module of the first embodiment in this regard. The power module of the first embodiment is configured to be a power module for a single phase such as a single-phase inverter, but in the power module of the third embodiment, a description is given below of an example of being configured to be a power module for three phase such as a three-phase inverter.

Three of the semiconductor switching device 23 and the diode 28 are each provided corresponding to a U phase, a V phase, and a W phase. Hence, three of the electrode pieces 84 that become output electrodes of each of the phases are also provided so as to extend outward from the middle electrodes 16, corresponding to the three switching devices 23 and the electrode pieces 84. Here, in FIG. 9, the three electrode pieces 84 are all connected to the single lead frame 51, but the electrode pieces 84 are respectively cut and insulated from each other after being molded.

On the other hand, the electrode piece 83 connected to the lower electrode 15, and the electrode piece 85 connected to the upper electrode (which is not shown in FIG. 9) can be shared by the three semiconductor switching devices 23 and diodes 28, and the single electrode piece 83 and electrode piece 85 are respectively provided. FIG. 9 shows a part extending inward (toward the signal lines 62, 63) of the electrode piece 85, which is connected to the upper electrode at the part. In the electrode piece 84 to be connected to the lower electrode 16, such a part extending inward is not shown, but in fact, a similar part extending inward is provided.

In addition, on the signal lines 62, 63, the lower electrode 15 sticks out of the middle electrodes 16, and the semiconductor switching devices 22 on the lower electrode 15 have parts that do not overlap with the middle electrodes 16. The semiconductor switching devices 22 on the lower electrode 15 have the parts that do not overlap with the middle electrodes 16 in the stacking direction, by which connecting the semiconductor switching devices 22 on the lower electrode 15 with the signal lines 62 by using bonding wires 72 can be readily carried out. Because three of the switching devices 22 on the lower electrode 15 are included corresponding to the three phase, the three of the semiconductor switching devices are connected to the signal lines 62 by wire bonding, any of which can ensure a connecting space, where the wire bonding can be readily performed.

Here, because the semiconductor switching devices 23 and the signal lines 63 on the middle electrodes 16 lie in the same plane, connection therebetween can be readily performed by general wire bonding with the bonding wires 73.

Thus, the power module of the third embodiment has a structure easy to form a parting line in molding because the signal lines 62, 63, the electrode pieces 83 through 85 and the middle electrodes 16 are all formed on the same lead frame 51, and in the same plane.

Figure 10:
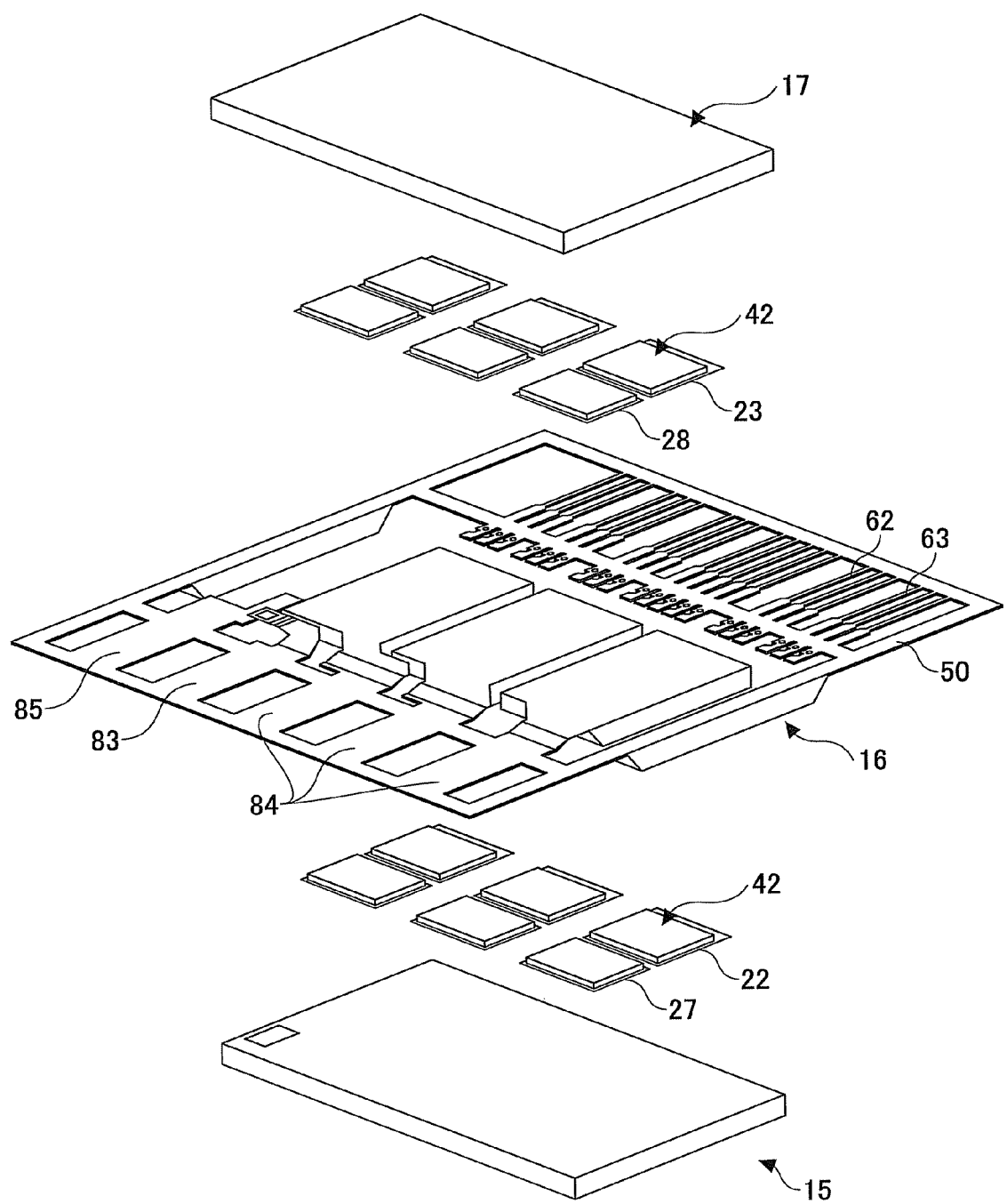
FIG. 10 is an exploded perspective view showing an example of the power module of the third embodiment.

FIG. 10 is an exploded perspective view showing an example of a power module of the third embodiment. In FIG. 10, since a configuration of the middle electrodes 16 corresponds to FIG. 9, the same numerals are attached to the same components as those of FIG. 9, and the description is omitted.

In FIG. 10, the power module of the third embodiment includes three semiconductor switching devices 22 and three diodes 27 arranged and bonded on a surface of the lower electrode 15, a spacer 42 provided on each of the semiconductor switching devices 22 and the diodes 27, and the middle electrodes 16 provided and stacked on the spacers 42. On the surface of the middle electrodes 16, three semiconductor switching devices 23 and three diodes 28 are provided, and the upper electrode 17 is stacked on the semiconductor switching devices 23 and the diodes 28 through the spacers 42. In the power module of the third embodiment, the lower electrode 15 and the upper electrode 17 are also made of a plate member, which is configured to improve the yield rate.

Figure 11:
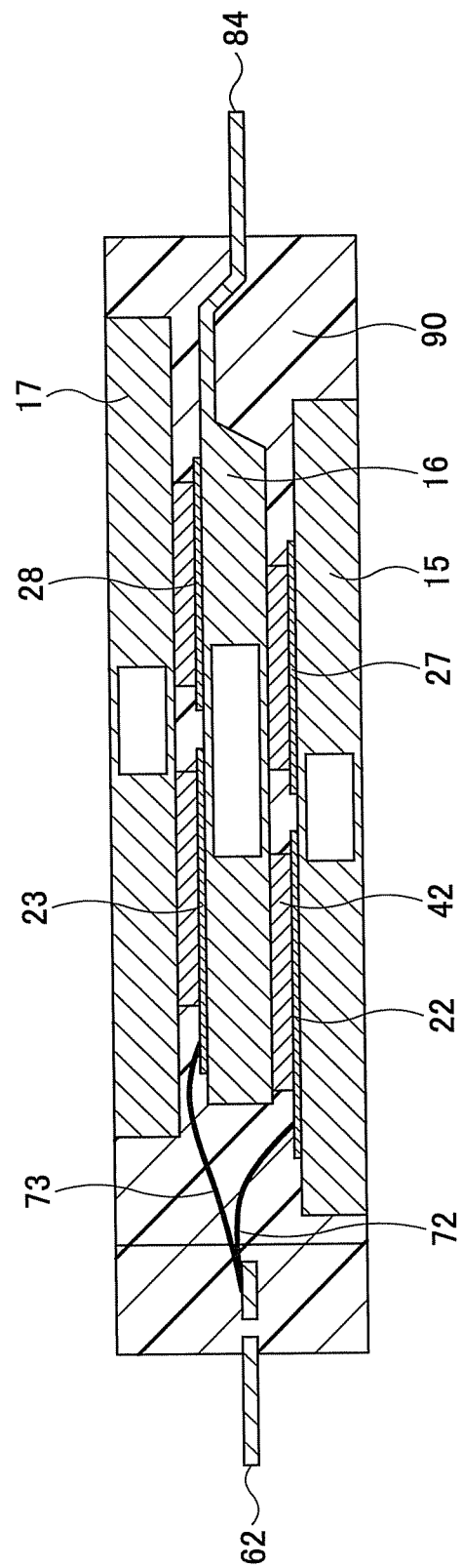
FIG. 11 is a cross-sectional configuration view showing an example of the power module of the third embodiment.

FIG. 11 is a cross-sectional view showing an example of the power module of the third embodiment. FIG. 11 shows a cross-sectional configuration that stacks the lower electrode 15, the semiconductor switching devices 22 and diodes 27, the spacers 42, the middle electrodes 16, the semiconductor switching devices 23 and diodes 28, and the upper electrode from the bottom in this order. The electrode pieces 84 horizontally extend outward to the right from the middle electrodes 16, and on the opposite side, the signal lines 62 are arranged to horizontally extend outward to the left. The semiconductor switching devices 22 on the lower electrode 15 are connected to the signal lines 62 from the under side by the bonding wires 73, and the semiconductor switching devices 23 on the middle electrodes 16 are connected to the signal lines 63 (which are not shown in FIG. 11) by the bonding wires 72. Because the semiconductor switching devices 22 have areas that do not overlap with the middle electrodes 16 in the stacking direction, and project toward the signal lines 62 from the middle electrodes 16, a connecting space by the bonding wires 72 is ensured, which makes it possible to readily perform the wire bonding.

In addition, although FIG. 11 does not show the electrode piece 85, there is a space that does not overlap with the middle electrodes 16 and the lower electrode 15 under the upper electrode 17, which makes it easy to connect the upper electrode 17 to the electrode piece 85.

Moreover, sides of the lower electrode 15, the middle electrodes 16 and the upper electrode 17 are molded by the mold resin 90, and the signal lines 62 and the electrode pieces 84 project from the mold resin 90 and become exposed. Since the signal lines 62 and the electrode pieces 84 lie in the same plane, and the signal lines 63 and the electrode pieces 83, 85 not shown in the drawing lie in the same plane, a configuration of the parting line when molding can be made easy. Furthermore, because the signal lines 62, 63 and the electrode pieces 83 through 85 are configured to be arranged opposite to each other through the middle electrodes 16, the signal lines 62, 63 can be separated from the electrode pieces 83 that are power lines through the middle electrodes 16, which has a configuration of preventing noise.

In addition, a lower surface of the lower electrode 15 and an upper surface of the upper electrode 17 are exposed without being sealed with resin, which has a configuration capable of improving cooling efficiency. For example, by providing a cooling fin on the exposed upper surface of the upper electrode 17 and the exposed lower surface of the lower electrode 15, the cooling efficiency of the power module can be enhanced.

Figure 12A:
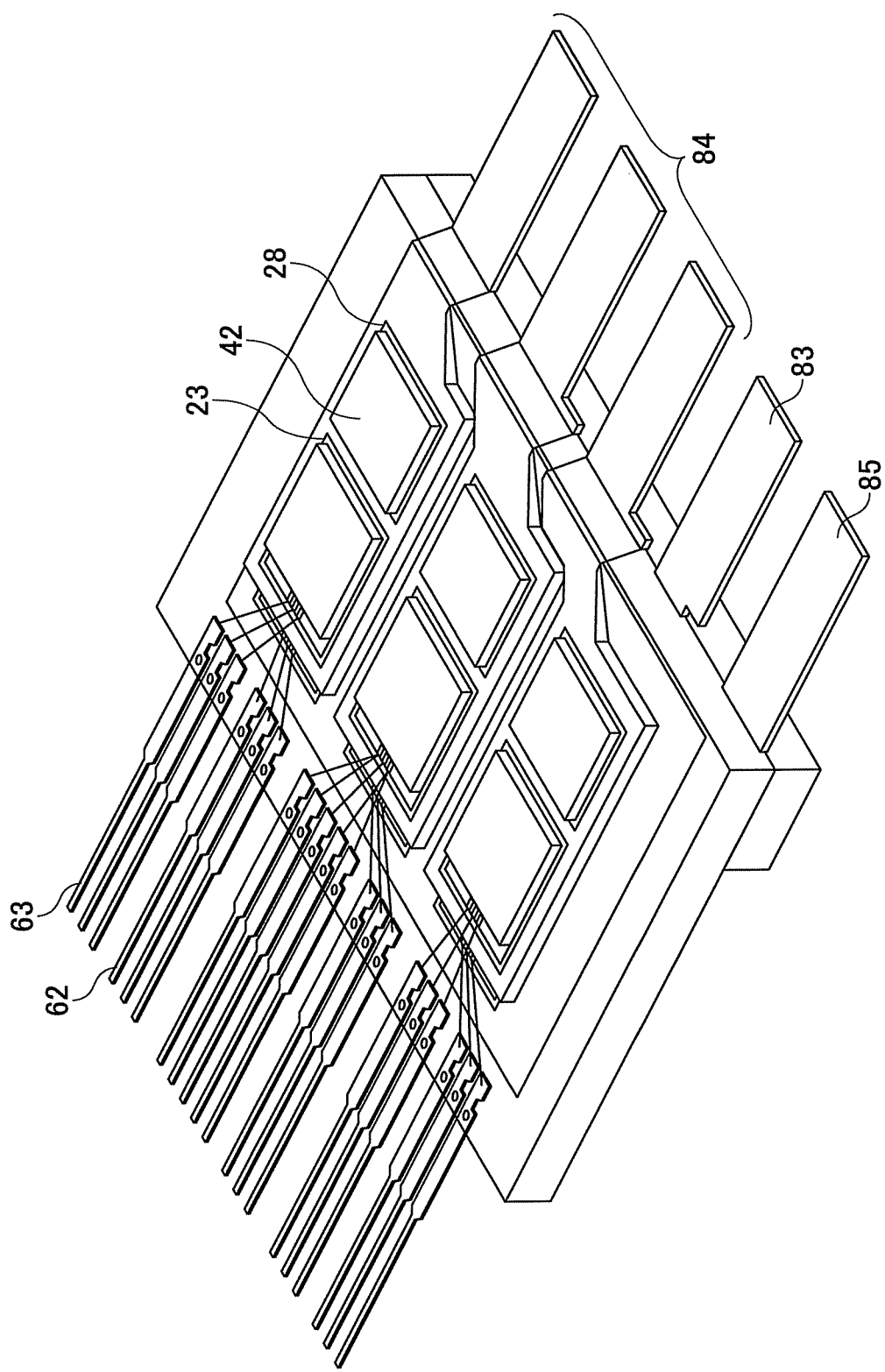
FIG. 12A is a perspective view showing a completed state of the power module of the third embodiment.

FIG. 12A is a perspective view showing a completed state of the power module of the third embodiment. FIG. 12A shows a state of including the electrode pieces 83 through 85 arranged on the front side, the signal lines 62, 63 arranged on the back side, and the semiconductor switching devices 23 and the diodes 28 arranged in the center. Three of the electrode pieces 84 are provided to project for three-phase output, and the single electrode piece 85 for the upper electrode 17 and the single electrode piece 83 for the lower electrode 15 are provided to project respectively because the electrode piece 85 and the electrode piece 83 can be shared in the three phase. In addition, the signal lines 62, 63 are configured to provide the signal lines 62 for the semiconductor switching devices 22 on the lower electrode 15 and the signal lines 63 for the semiconductor switching devises 23 on the middle electrodes 16 in the same plane.

Figure 12B:
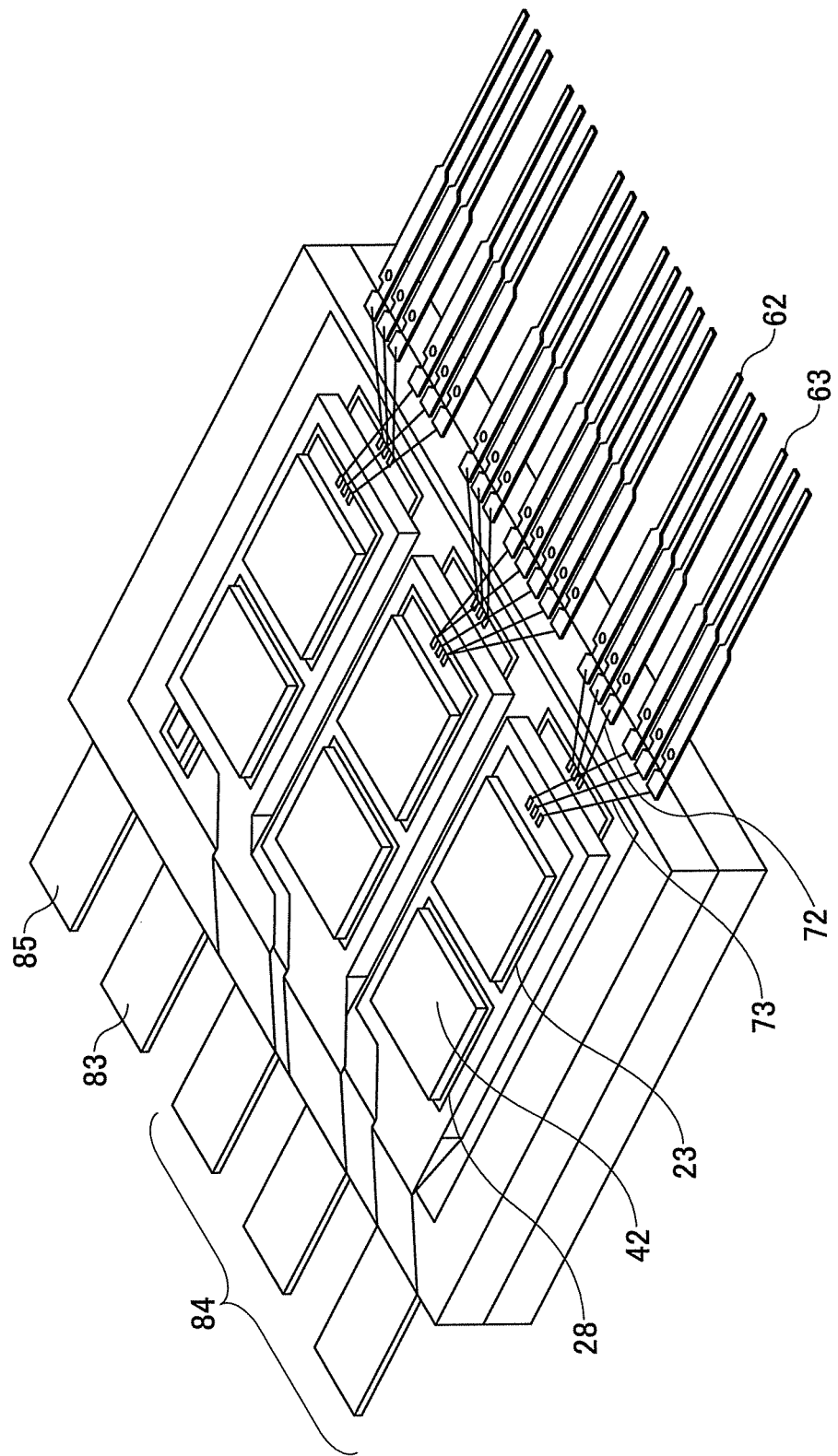
FIG. 12B is a perspective view showing the power module of the third embodiment shown in FIG. 12A from an opposite side.

FIG. 12B is a perspective view showing the power module of the third embodiment shown in FIG. 12 from the opposite side. FIG. 12B shows the signal lines 62, 63 on the front side, and shows that the wire bonding between the semiconductor switching devices 23 and the signal lines 63 by using the bonding wires 73 in the same plane, and the wire bonding between the semiconductor switching devices 22 on the lower electrode 15 and the signal lines 62 by using the bonding wire 72 are performed alternately.

According to the power module of the third embodiment, even in the three-phase power module, molding can be made easy; the electrode shape can be simplified; and the yield rate can be improved.

Next, using FIGS. 13A through 13E, a description is given below of a method of manufacturing the power module of the third embodiment. FIGS. 13A through 13E are views showing a series of processes of an example of the method of manufacturing the power module of, the third embodiment. Here, the same numerals are attached to the components already described in the third embodiment, and the description is omitted.

Figure 13A:
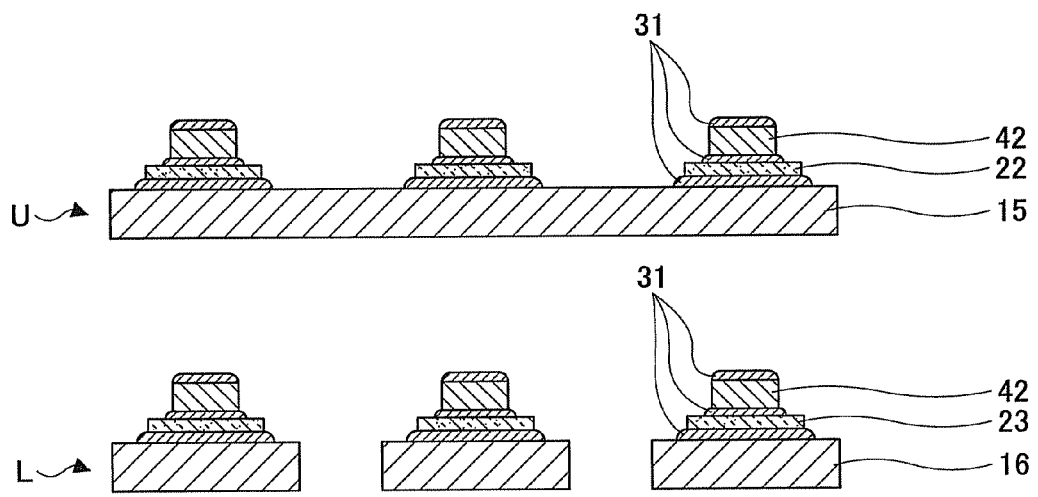
FIG. 13A is a front view showing an example of a semiconductor switching device bonding process of a method of manufacturing the power module of the third embodiment.

FIG. 13A is a front view showing an example of a semiconductor switching device bonding process of the method of manufacturing the power module of the third embodiment. In the semiconductor switching device bonding process, the semiconductor switching devices 22, 23 are respectively bonded on the lower electrode 15 and the middle electrodes 16. More specifically, the semiconductor switching devices 22 are bonded on the surface of the middle electrodes 16 by soldering by suing the solder 31. Here, in the semiconductor switching device bonding process, the spacers 42 are also bonded on the semiconductor switching devices 22, 23 by soldering by using the solder 31 other than the semiconductor switching devices 22, 23.

Here, in FIG. 13A, as shown in FIG. 9, since the lower electrode 15 is a single plate-like electrode, three of the semiconductor switching devices 22 are bonded on the surface of the plate-like lower electrode 15. In contrast, because the middle electrodes 16 have a shape divided into each bonding area for each phase of the semiconductor switching devices 23, which is correspondent in FIG. 13A, the semiconductor switching devices 23 are separately bonded and arranged on the middle electrodes 16.

By performing the semiconductor switching device bonding process, the upper arm and the lower arm of the power module are completed. Here, the upper arm is a plus side, and the lower arm is a minus side, but in the present embodiment, a description is given by assuming the lower electrode 15 and the semiconductor switching devise 22 bonded on the surface of the lower electrode 15 to be the upper arm U, and by assuming the middle electrodes 16 and the semiconductor switching devices 23 bonded on the middle electrodes 16 to be the lower arm L.

Figure 13B:
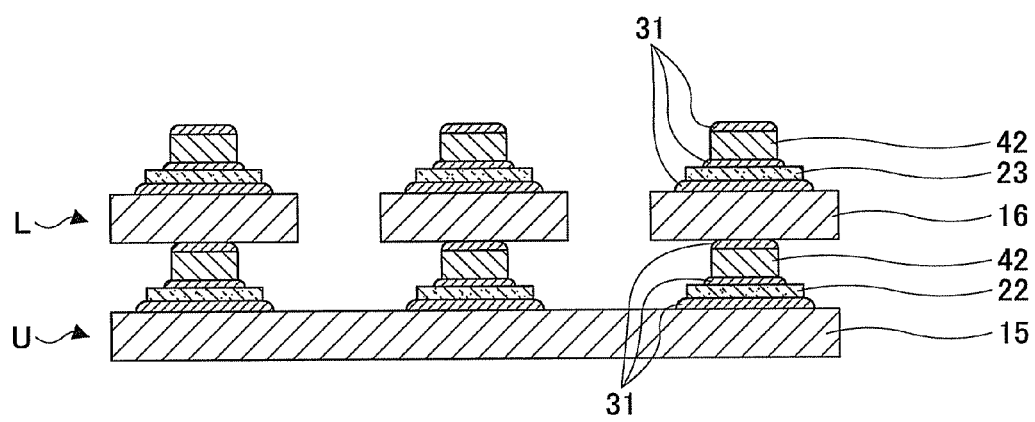
FIG. 13B is a front view showing an example of an upper arm and a lower arm bonding process of the method of manufacturing the power module of the third embodiment.

FIG. 13B is a front view showing an example of an upper arm/lower arm bonding process of the method of manufacturing the power module of the third embodiment. In the upper arm/lower arm bonding process, the upper arm U and the lower atm L are soldered to each other. In FIG. 13B, the lower arm L including the middle electrodes 16 and the semiconductor switching devices 23 are soldered on the upper arm U including the lower electrode 15 and the semiconductor switching devices 22 by the solder 31.

Figure 13C:
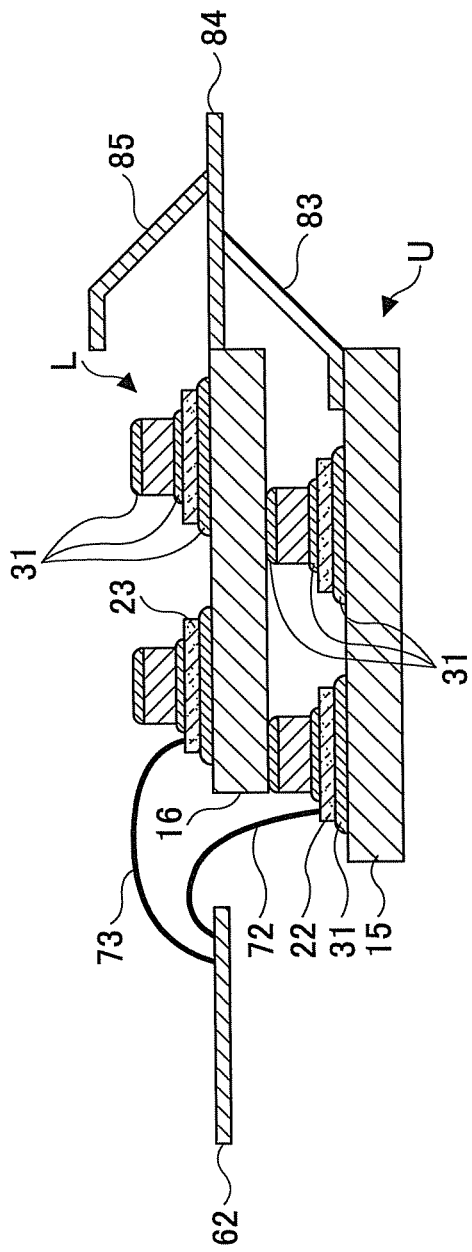
FIG. 13C is a side view showing an example of a wire bonding process of the method of manufacturing the power module of the third embodiment.

FIG. 13C is a side view showing an example of a wire bonding process of the method of manufacturing the power module of the third embodiment. In FIGS. 13A and 13B, a front view is shown, but in FIG. 13C, a side view is shown to be able to understand connection relationship of the wire bonding process. In the wire bonding process, connecting the semiconductor switching devices 22, 23 to the signal lines 62, 63 by using the bonding wires 72, 73 are carried out. As shown in FIG. 13C, although the semiconductor switching devices 22, 23 on the surface of the lower electrode 15 have a difference in level with the signal lines 62 lying in the same plane as the middle electrodes 16, the semiconductor switching devices 22 have parts that are not covered with the middle electrodes 16, and a connecting space to arrange the bonding wires 72 is ensured. Moreover, the semiconductor switching devices 23 on the middle electrodes 16 are connected to the signal lines 63 lying in the same plane. Here, a wire made of a variety of materials is used for the bonding wires 72, 73 according to the intended use, and for example, an aluminum wire may be used.

Furthermore, on the opposite side of the signal lines 62, 63, the electrode pieces 83 through 85 are provided, and connecting the electrode piece 83 with the lower electrode 15 is performed in this stage at the same time. The connection of the electrode piece 83 may be soldering using the solder 31.

Figure 13D:
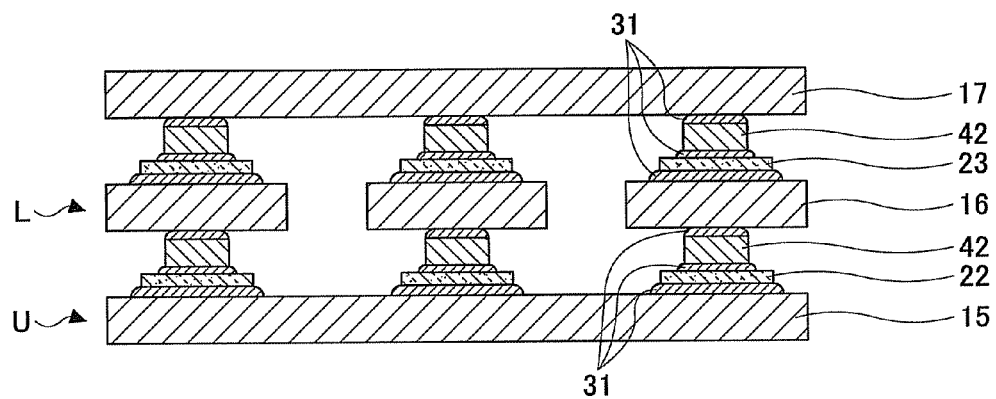
FIG. 13D is a front view showing an example of an upper electrode bonding process of the method of manufacturing the power module of the third embodiment.

FIG. 13D is a front view showing an example of an upper electrode bonding process of the method of manufacturing the power module of the third embodiment. In the upper electrode bonding process, the upper electrode 17 is bonded on the upper part of the semiconductor switching devices 23 on the middle electrodes 16. The connection may be performed by soldering using the solder 31. By doing this, when the semiconductor switching devices 23 of the lower arm L are IGBTs, emitters of the IGBT are connected to each other.

Here, in the upper electrode bonding process, soldering between the upper electrode 17 and the electrode piece 85 may be performed together. By performing the upper electrode bonding process, electrical connection of the stacking-type power module is completed.

Figure 13E:
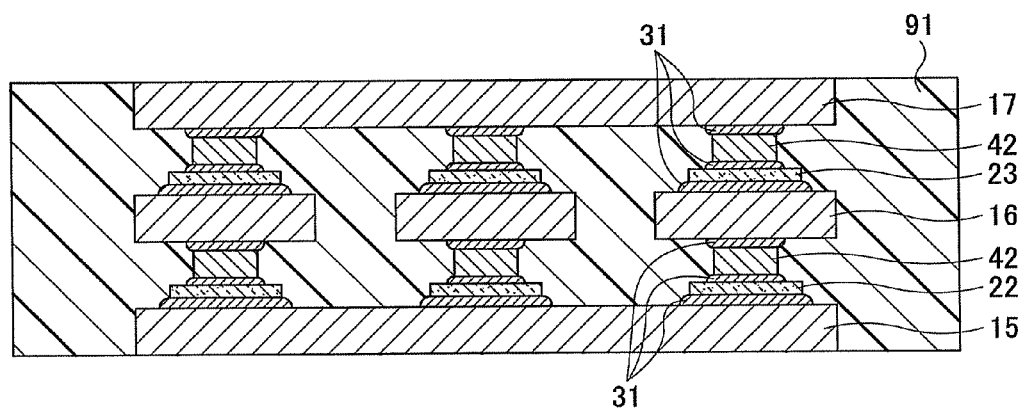
FIG. 13E is a front view showing an example of a molding process of the method of manufacturing the power module of the third embodiment.

FIG. 13E is a front view showing an example of a molding process of the method of manufacturing the power module of the third embodiment. In the molding process, the remaining part other than the upper surface of the upper electrode 17 and the lower surface of the lower electrode 15 is sealed by the mold resin. At this time, as shown in FIG. 13C, the parting line of the die can be configured to be a simple shape because the die has only to clamp the signal lines 62, 63 and the electrode pieces 83 through 85 in the same plane.

Moreover, since a plate member can be used for the upper electrode 17 and the lower electrode 15, the electrode configuration can simplified and the yield rate can be improved.

After that, a cooling fin may be provided on the upper surface of the upper electrode 17 and/or the lower surface of the lower electrode as necessary, taking a configuration that improves the cooling efficiency of the power module is possible. Since the lower electrode 15 and the upper electrode 17 are just plate members, the process for providing the fin can be readily carried out.

Here, the configuration of providing the cooling fin on the upper surface of the upper electrode 17 and/or the lower surface of the lower electrode 15 can be applied to the power module of the first and second embodiments.

As discussed above, although the embodiments of the present invention have been described in detail, it should be understood that various changes, substitutions, and alterations could be made hereto without departing from the spirit and scope of the invention.

INDUSTRIAL APPLICABILITY

The present invention is applicable to a power module using an IGBT, a power MOS transistor and the like as a semiconductor switching device.

The invention claimed is:

1. A power module comprising:
   a first electrode;
   a first switching device bonded on a surface of the first electrode;
   a second electrode;
   a second switching device bonded on the second electrode;
   a third electrode, the first electrode, the first switching device, the second electrode, the second switching device, and the third electrode being arranged in this order from a bottom in a stacking direction;
   first through third electrode pieces each connected to the first through third electrodes;
   first and second signal lines each connected to the first and second switching devices,
   wherein the first through third electrode pieces and the first and second signal lines are provided extending outward in the same plane as the second electrode.

2. The power module as claimed in claim 1,
   wherein the first switching device has an area that is not covered with the second electrode in the stacking direction.

3. The power module as claimed in claim 2,
   wherein the first through third electrode pieces and the first and second signal lines are formed on a same lead frame.

4. The power module as claimed in claim 3,
   wherein a bonding part of the third electrode piece has an area that does not cover the first and second electrode pieces in the stacking direction.

5. The power module as claimed in claim 4,
   wherein the first through third electrode pieces and the first and second signal lines are provided opposite to each other through the second electrode.

6. The power module as claimed in claim 5,
   wherein the first and second signal lines are respectively connected to the first and second switching devices by wire bonding.

7. The power module as claimed in claim 6,
   wherein the first and second electrodes are congruent in shape.

8. The power module as claimed in claim 7,
wherein the first and second electrodes have a rectangular shape.

9. The power module as claimed in claim 8,
wherein the first switching device and the second electrode, and the second switching device and the third electrode are stacked through spacers made of a metal block.

10. The power module as claimed in claim 9,
wherein the first through third electrodes, the first through third electrode pieces and the first and second signal lines are sealed with resin by molding so that only outside parts of the first through third electrodes and the first and second signal lines are exposed from the resin.

* * * * *